(12) United States Patent
Liao

(10) Patent No.: US 9,437,542 B2
(45) Date of Patent: Sep. 6, 2016

(54) CHIP PACKAGE STRUCTURE

(71) Applicant: ChipMOS Technologies Inc., Hsinchu (TW)

(72) Inventor: Tsung-Jen Liao, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 14/985,423

(22) Filed: Dec. 31, 2015

(65) Prior Publication Data

US 2016/0111364 A1 Apr. 21, 2016

Related U.S. Application Data

(62) Division of application No. 14/324,260, filed on Jul. 7, 2014, now Pat. No. 9,269,643.

(51) Int. Cl.

| | |
|---|---|
| *H01L 23/522* | (2006.01) |
| *H01L 23/31* | (2006.01) |
| *H01L 23/433* | (2006.01) |
| *H01L 23/538* | (2006.01) |
| *H01L 23/64* | (2006.01) |
| *H01L 23/367* | (2006.01) |
| *H01L 23/528* | (2006.01) |
| *H01L 23/00* | (2006.01) |
| *H01L 23/498* | (2006.01) |

(52) U.S. Cl.
CPC ....... *H01L 23/5227* (2013.01); *H01L 23/3107* (2013.01); *H01L 23/3114* (2013.01); *H01L 23/3677* (2013.01); *H01L 23/4334* (2013.01); *H01L 23/49822* (2013.01); *H01L 23/528* (2013.01); *H01L 23/5226* (2013.01); *H01L 23/5389* (2013.01); *H01L 23/645* (2013.01); *H01L 24/06* (2013.01); *H01L 24/14* (2013.01); *H01L 23/3128* (2013.01); *H01L 23/49816* (2013.01); *H01L 2224/0401* (2013.01); *H01L 2224/05025* (2013.01); *H01L 2224/12105* (2013.01); *H01L 2224/13014* (2013.01); *H01L 2224/13016* (2013.01); *H01L 2224/18* (2013.01); *H01L 2924/0002* (2013.01)

(58) Field of Classification Search
CPC .................. H01L 23/49822; H01L 23/49816; H01L 23/5389; H01L 23/3114; H01L 23/4334; H01L 23/645; H01L 23/36; H01L 23/5227; H01L 23/3107; H01L 23/3677; H01L 23/5226; H01L 23/528; H01L 24/06; H01L 24/14
USPC .......................... 257/531, E21.022, 778, 706
See application file for complete search history.

(56) References Cited

U.S. PATENT DOCUMENTS

2013/0307140 A1* 11/2013 Huang .................... H01L 24/19
257/737

* cited by examiner

*Primary Examiner* — Thien F Tran
(74) *Attorney, Agent, or Firm* — Jianq Chyun IP Office

(57) ABSTRACT

A chip package structure is provided. The chip package structure includes a chip, at least one inducting coil, a molding compound and a redistribution circuit layer. The chip includes an active surface, a back surface opposite to the active surface. The inducting coil is disposed around a periphery region of the chip. The molding compound covers the chip and the periphery region and exposes the active surface. The inducting coil is disposed at the molding compound. The redistribution circuit layer covers the active surface, part of the molding compound and part of the inducting coil, and electrically connects the chip.

18 Claims, 7 Drawing Sheets

CHIP PACKAGE STRUCTURE

CROSS-REFERENCE TO RELATED APPLICATION

This is a divisional application of and claims the priority benefit of U.S. patent application Ser. No. 14/324,260, filed on Jul. 7, 2014, now allowed, which claims the priority benefit of Taiwan application serial no. 102146307, filed on Dec. 16, 2013. The entirety of each of the above-mentioned patent applications is hereby incorporated by reference herein and made a part of this specification.

BACKGROUND OF THE INVENTION

1. Field of the Invention

The invention relates to a semiconductor package structure, and particularly relates to a chip package structure.

2. Description of Related Art

With the advance of integration of integrated circuits, packaging structures of chips are more and more complicated and diversified. Generally speaking, inductor is an essential passive device, which is widely used in radio frequency (RF) circuits, voltage controlled oscillators (VCO), low noise amplifiers (LNA) or other power amplifiers (PA).

Usually, inductance is increased by increasing the number of turns of a coil in the manufacture of a high-frequency inductance element in a semiconductor element. However, an area required for the inductance on a chip correspondingly increases with the increase in the number of turns. Due to the trend to miniaturize the size of the chip, there is no enough space to dispose the inductor. Besides, to facilitate a heat dissipating efficiency of a package structure, it is common to dispose a heat dissipating sheet on the package structure. In the conventional art, the heat dissipating sheet is usually adhered to the surface of the package structure with adhesive or solder. However, the heat dissipating sheet is not able to be firmly adhered to the package structure with such configuration, making the heat dissipating sheet ablated or detached from the package structure. The yield rate and reliability in use of the products are thus influenced, not to mention that an additional cost for the heat dissipating sheets is required.

SUMMARY OF THE INVENTION

The invention provides a chip package structure capable of increasing an area to design the inducting coil, reducing interference between an inducting coil and a chip, and facilitating a heat dissipating efficiency.

A chip package structure of the invention includes a chip, at least an inducting coil, a molding compound, and a redistribution circuit layer. The chip includes an active surface and a back surface opposite to the active surface. The inducting coil is disposed around a first periphery region of the chip. The molding compound includes an upper surface and a lower surface opposite to the upper surface, covers the chip and the periphery region, and exposes the active surface. In addition, the inducting coil is disposed on the molding compound and the lower surface of the molding compound is substantially aligned with respect to the active surface. The redistribution circuit layer covers the active surface, a part of the molding compound, and a part of the inducting coil, and is electrically connected with the chip.

A chip package structure of the invention includes a chip, a plurality of heat dissipating pillars, a molding compound, and a redistribution circuit layer. The chip includes an active surface and a back surface opposite to the active surface. The heat dissipating pillars are disposed around a periphery region of the chip. The molding compound covers the chip and the periphery region and exposes the active surface. The heat dissipating pillars are disposed at the molding compound, and the molding compound exposes a part of each of the heat dissipating pillars. The redistribution circuit layer covers the active surface and a part of the molding compound, and is electrically connected with the chip.

A chip package structure of the invention includes a chip, at least an inducting coil, a plurality of heat dissipating pillars, a molding compound, and a redistribution circuit layer. The chip includes an active surface and a back surface opposite to the active surface. The inducting coil is disposed around a first periphery region of the chip. The heat dissipating pillars are disposed around a periphery region of the chip. The first and second periphery regions are not overlapped with each other. The molding compound covers the chip, the first periphery region, and the second periphery region, and exposes the active surface. The inducting coil and the heat dissipating pillars are disposed on the molding compound, and the molding compound exposes a part of each of the heat dissipating pillars. The redistribution circuit layer covers the active surface and a part of the molding compound, and is electrically connected with the chip.

Based on the above, the inducting coil is disposed around the periphery region of the chip in the chip package structure of the invention to serve as an inductance element of the chip package structure. Thus, the area to dispose the inductance in the chip package structure is increased and no longer limited to the surface of the chip. The inductance of the chip package structure is consequently increased. Also, the inducting coil of the invention is disposed around the chip instead of being disposed on the active surface of the chip. Therefore, the signal interference between the inducting coil and the chip is reduced. Furthermore, in the chip package structure of the invention, the plurality of heat dissipating pillars may also be disposed around the periphery region of the chip, and the heat dissipating pillars are exposed by the molding compound. Consequently, the chip package structure is allowed to discharge heat generated by the chip through the heat dissipating pillars disposed around the chip, thereby facilitating the heat dissipating efficiency of the chip package structure and saving the cost of disposing an additional heat dissipating element such as a heat dissipating paste or heat sink, etc.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
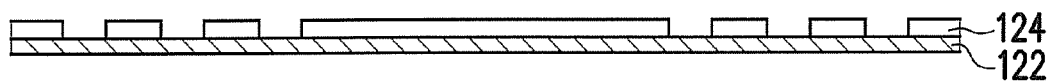
FIGS. 1A to 1F are schematic sectional views showing a flow of a manufacturing method of a chip package structure according to an embodiment of the invention.

It is to be understood that both the foregoing and other detailed descriptions, features, and advantages are intended to be described more comprehensively by providing embodiments accompanied with figures hereinafter. In the following embodiments, wordings used to indicate directions, such as "up," "down," "front," "back," "left," and "right", merely refer to directions in the accompanying drawings. Therefore, the directional wording is used to illustrate rather than limit the present invention. In addition, in the embodiments hereinafter, same or like elements are represented by same or like reference numerals.

Figure 1B:
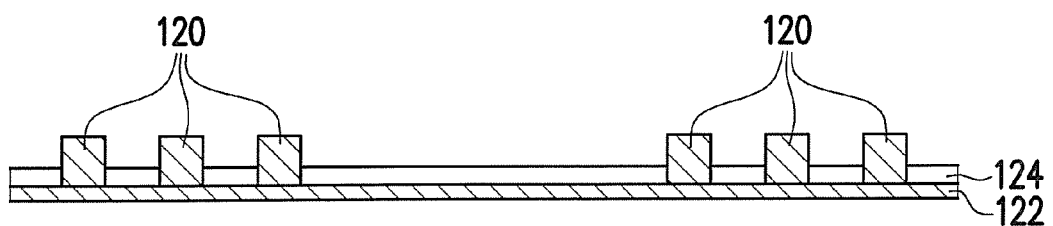
Figure 1C:
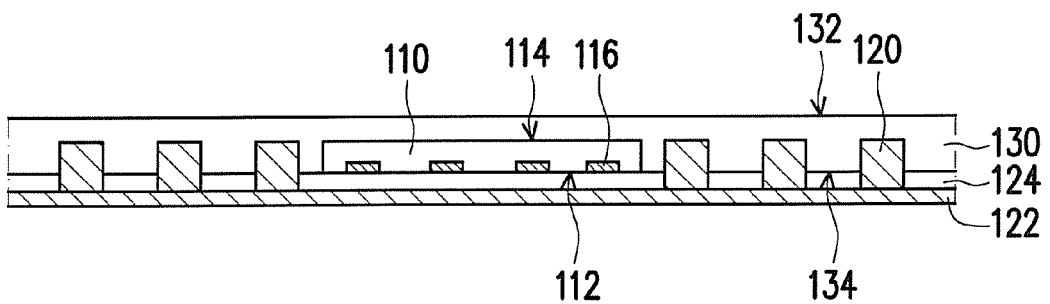
Figure 1D:
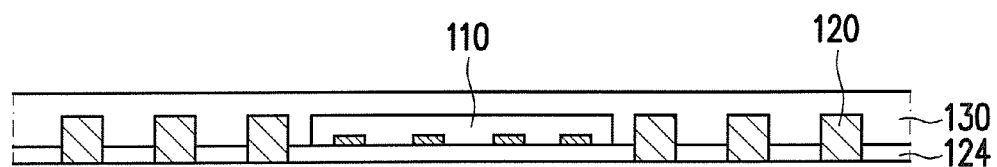
Figure 1E:
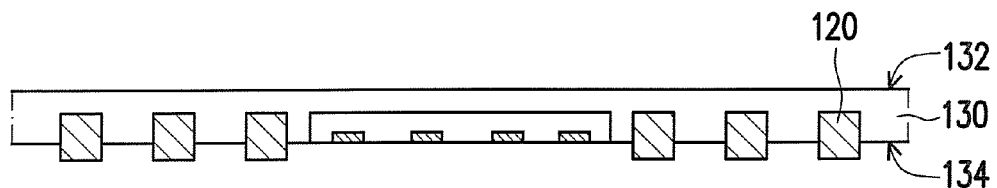
Figure 1F:
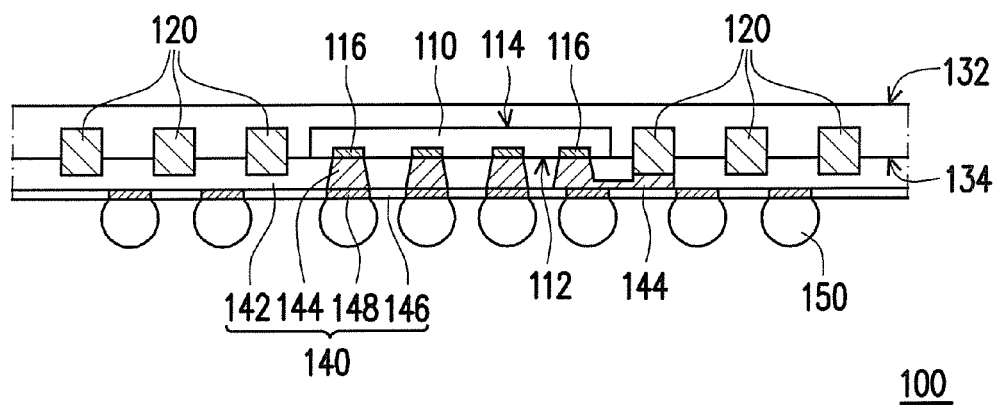
Figure 2:
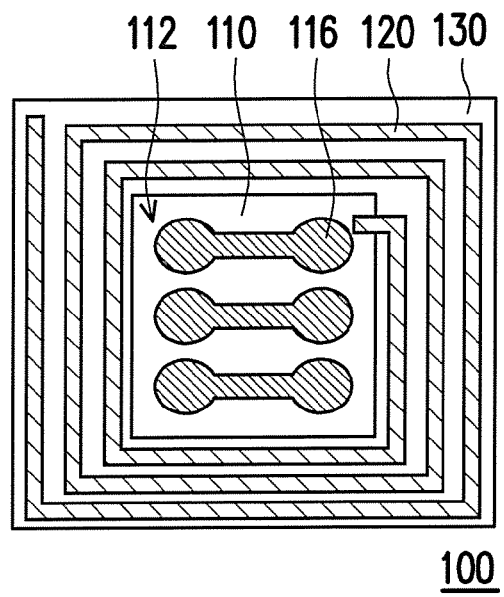
FIG. 2 is schematic bottom view of a configuration of an inducting coil and a chip according to an embodiment of the invention.
Figure 3:
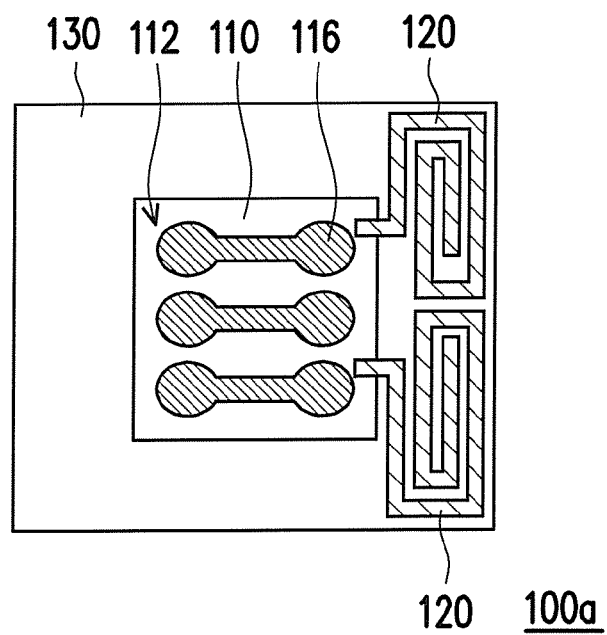
FIG. 3 is schematic bottom view of a configuration of an inducting coil and a chip according to another embodiment of the invention.

FIGS. 1A to 1F are schematic sectional views showing a flow of a manufacturing method of a chip package structure according to an embodiment of the invention. FIG. 2 is schematic bottom view of a configuration of an inducting coil and a chip according to an embodiment of the invention. FIG. 3 is schematic bottom view of a configuration of an inducting coil and a chip according to another embodiment of the invention. Referring to FIGS. 1F and 2, in this embodiment, a chip package structure 100 includes a chip 110, at least one inducting coil 120, a molding compound 130, and a redistribution circuit layer 140. The chip 110 includes an active surface 112 and a back surface 114 opposite to the active surface 112. The inducting coil 120 may be disposed around a periphery region of the chip 110, as shown in FIG. 2. The molding compound 130 covers the chip 110 and the periphery region of the chip 110 and exposes the active surface 112 of the chip 110. The inducting coil 120 is disposed on the molding compound 130, the redistribution circuit layer 140 covers the active surface 112, a part of the molding compound 130, and a part of the inducting coil 120, and electrically connects the chip 110 and the inducting coil 120. In this embodiment, the inducting coil 120 and the chip 110 are electrically connected with each other. However, the invention is not limited thereto. In another embodiment, the inducting coil 120 may not be electrically connected with the redistribution circuit layer 140.

Specifically speaking, in this embodiment, the chip 110 further includes a plurality of pads 116 that are respectively disposed on the active surface 112, and the redistribution circuit layer 140 electrically connects the inducting coil 120 with one of the pads 116, as shown in FIG. 1F. In this embodiment, a number of the inducting coil 120 may be one. Naturally, in other embodiments of the invention, the number of the inducting coil 120 may be plural, as shown in FIG. 3, and the redistribution circuit layer 140 may electrically connect each of the inducting coils 120 to the chip 110. The invention does not intend to impose a limitation on the number of the inducting coil 120 and how the inducting coil 120 is arranged to be disposed around the chip 110.

Specifically speaking, the molding compound 130 includes an upper surface 132 and a lower surface 134 opposite to the upper surface 132. In addition, the lower surface 134 is substantially aligned with respect to the active surface 112. The redistribution circuit layer 140 covers the active surface 112 and the lower surface 134 of the molding compound 130. In this embodiment, the redistribution circuit layer 140 includes a first protective layer 142, a patterned conductive layer 144, a second protective layer 146, a plurality of solder pads 148. Specifically speaking, the first protective layer 142 may cover the active surface 112 and the lower surface 134 of the molding compound 130. The patterned conductive layer 144 may cover the first protective layer 142. In addition, the patterned conductive layer 144 is connected with the pads 116 respectively and electrically connects the inducting coil 120 to one of the pads 116. The second protective layer 146 covers the first protective layer 142 and a part of the patterned conductive layer 144. In addition, the second protective layer 146 may have a plurality of openings, as shown in FIG. 1F, so as to expose parts of the patterned conductive layer 144. The solder pads 148 are disposed on the second protective layer 146 and respectively connected with the parts of the patterned conductive layer 144 that are exposed by the openings of the second protective layer 146. In this embodiment, the chip package structure 100 may further include a plurality of solder balls 150 that are respectively disposed on the solder pads 148. The solder pad 148 may include an under bump metallurgic (UBM) layer formed of an adhesion layer, a barrier layer, and a wetting layer, so as to enhance a bonding strength between the solder balls 150 and the solder pads 148 and prevent electro-migration.

With such configuration, the inducting coil 120 is disposed around the periphery region of the chip 110 in the chip package structure 100 of this embodiment to serve as an inductance element of the chip package structure 100. In this way, an area to dispose the inducting coil 120 is no longer limited to a surface of the chip, and an inductance disposition area of the chip package structure 100 is increased, thereby increasing inductance of the chip package structure 100. Besides, compared with the conventional art that directly disposes the inductance element on the active surface 112 of the chip 110, the inducting coil 120 of this embodiment is disposed around the chip 110, and is thus capable of reducing signal interference between the inducting coil 120 and the chip and consequently facilitating a reception quality. Besides, the inducting coil 120 disposed around the chip 110 may further facilitate heat dissipation of the chip and facilitate a heat dissipation efficiency of the chip package structure 100.

Furthermore, in this embodiment, the inducting coil 120 may be embedded into the molding compound 130 as shown in FIG. 1F, a surface of the inducting coil 120 away from the upper surface 132 may be projected from the lower surface 134 as shown in FIG. 1F, and the patterned conductive layer 144 connects a part of the inducting coil 120 projected from the lower surface 134 to one of the pads 116. A manufacturing method of the chip package structure 100 is described below.

First, referring to FIG. 1A, a metal layer 122 is provided, and a patterned dry film 124 is disposed on the metal layer 122. Then, as shown in FIG. 1B, a plating process is performed by using the patterned dry film 124 as a plating mask to form the inducting coil 120. A chip disposition area is configured at the center of the inducting coil 120, and the inducting coil 120 may be disposed around the chip disposition area. Then, referring to FIG. 1C, the chip 110 is disposed on the patterned dry film 124 to locate the chip 110 in the chip disposition area. Then, the molding compound 130 is formed on the chip 110 and the periphery region of the chip 110, such that the inducting coil 120 may be disposed around the periphery region of the chip and embedded into the molding compound 130, as shown in FIG. 2. The chip 110 includes the plurality of pads 116 as well as the active surface 112 and the back surface 114 that are opposite to each other. The pads 116 are disposed on the active surface 112, and the molding compound 130 includes the upper and lower surfaces 132 and 134 opposite to each other. Also, the lower surface 134 is substantially aligned with respect to the active surface 112.

Then, referring to FIGS. 1D and 1E, the metal layer 122 is removed by, for example, using an etching process, the patterned dry film 124 is removed to expose the active surface 112 and the lower surface 134 of the molding compound 130, and the surface of the inducting coil 120 away from the upper surface 132 is projected from the lower surface 134 as shown in FIG. 1E. Afterwards, the redistribution circuit layer 140 is formed, as shown in FIG. 1F. The redistribution circuit layer 140 electrically connects the inducting coil 120 and one of the pads 116. Then, the plurality of solder balls 150 respectively form electrical connection with the redistribution circuit layer 140 to substantially complete manufacture of the chip package structure 100.

Specifically speaking, formation of the redistribution circuit layer 140 may includes the following steps. First, the first protective layer 142 is formed on the active surface 112 and the lower surface 134 of the molding compound 130. Then, the patterned conductive layer 144 is formed on the first protective layer 142. In addition, the patterned conductive layer 144 is connected with the pads 116 respectively and connects the part of the inducting coil 120 projected from the lower surface 134 to one of the pads 116, so as to electrically connect the inducting coil 120 and the chip 110. Then, the second protective layer 146 is formed on the first protective layer 142 and the patterned conductive layer 144. Moreover, the second protective layer 146 exposes the parts of the patterned conductive layer 144. Subsequently, the plurality of solder pads 148 are formed on the second protective layer 146, and then the solder pads 148 are connected with the parts of the patterned conductive layer 144 exposed by the second protective layer 146. Accordingly, manufacture of the redistribution circuit layer 140 is completed. Then, the plurality of solder balls 150 may be respectively disposed on the solder pads 148 to serve as external terminals for the chip package structure 100 to be electrically connected with other electronic elements.

Figure 4A:
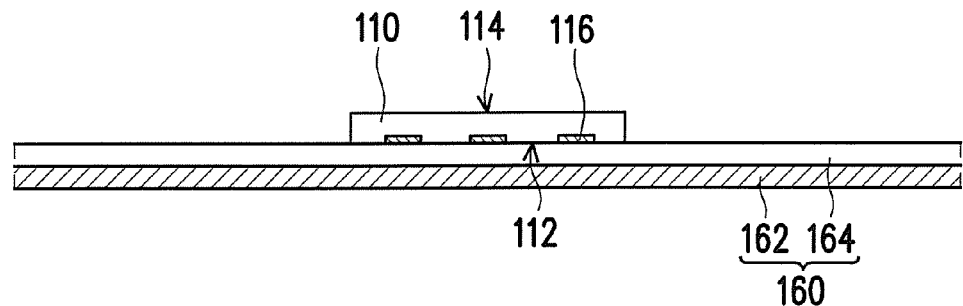
FIGS. 4A to 4F are schematic sectional views showing a flow of a manufacturing method of a chip package structure according to another embodiment of the invention.
Figure 4B:
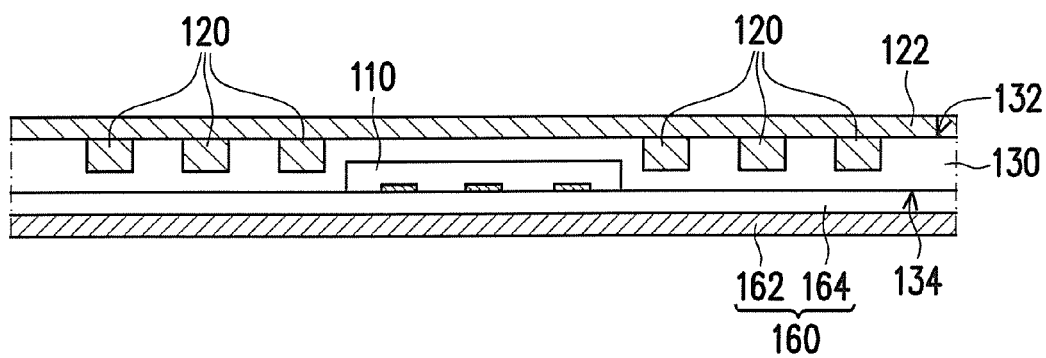
Figure 4C:
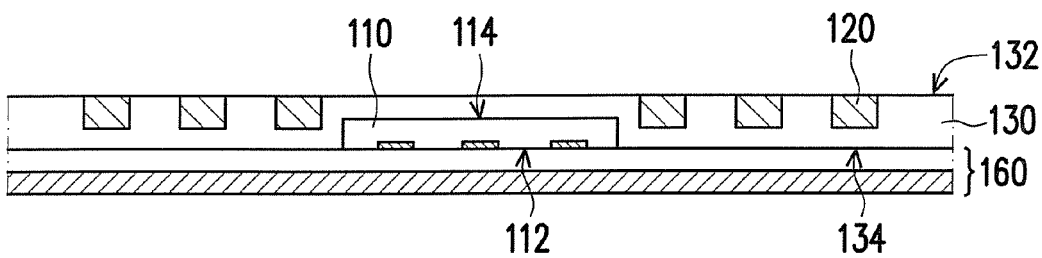
Figure 4D:
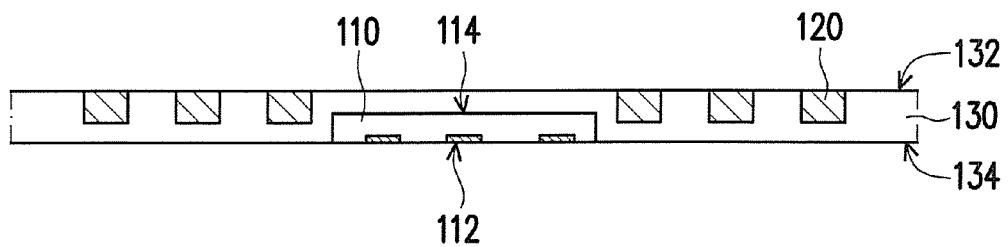
Figure 4E:
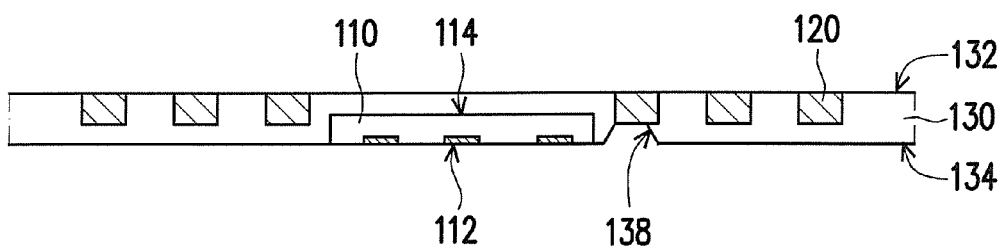
Figure 4F:
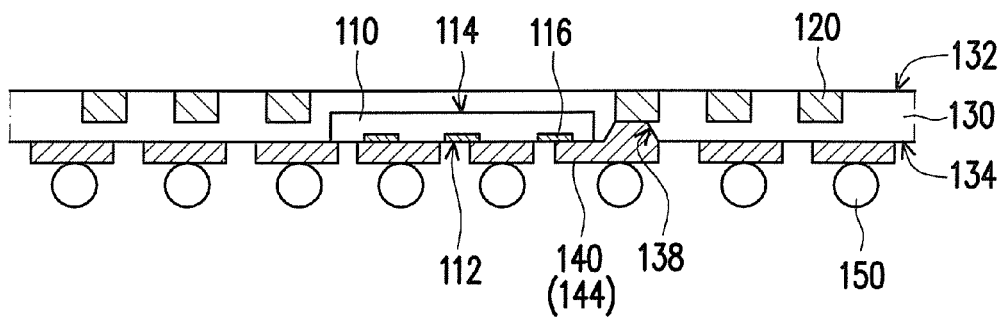

FIGS. 4A to 4F are schematic sectional views showing a flow of a manufacturing method of a chip package structure according to another embodiment of the invention. It should be noted that the chip package structure 100 of this embodiment shown in FIG. 4F is similar to the chip package structure 100 shown in FIG. 1F. Thus, the reference numerals and a part of the contents in the previous embodiment are used in the following embodiments, in which identical reference numerals indicate identical or similar elements, and repeated description of the same technical contents is omitted. For a detailed description of the omitted parts, reference can be found in the previous embodiment, and no repeated description is contained in this embodiment. Description regarding differences between the chip package structure 100 shown in FIG. 4F and the chip package structure 100 shown in FIG. 1F is provided below.

In this embodiment, the inducting coil 120 of the chip package structure 100 may be embedded into the molding compound 130, as shown in FIG. 4F. In addition, a surface of the inducting coil 120 away from the lower surface 134 of the molding compound 130 is substantially aligned with respect to the upper surface 132 of the molding compound 130. Furthermore, the molding compound 130 may further include a via 138 to expose a part of the inducting coil 120. The redistribution circuit layer 140 may include the patterned conductive layer 144. The patterned conductive layer 144 connects the part of the inducting coil 120 exposed by the via 138 to one of the pads 116, so as to electrically connect the inducting coil 120 and the chip 110. A manufacturing method of the chip package structure 100 shown in FIG. 4F is described below to clearly describe a configuration of elements of the chip package structure 100 of this embodiment.

First, the inducting coil 120 is formed on the metal layer 122 according to the illustration of FIGS. 1A and 1B. Also, referring to FIG. 4A, the chip 110 is formed on a support layer 160. The chip 110 includes the plurality of pads 116 and the active and back surfaces 112 and 114 opposite to each other, as described in the embodiment above. In this embodiment, the support layer 160 may be formed of a copper coil layer 162 and a dry film 164, for example, to support the chip 110. Referring to FIG. 4B, the molding compound 130 is formed on the support layer 160 and covers the chip 110. The inducting coil 120 and the metal layer 122 framed according to the illustration of FIGS. 1A and 1B are laminated together onto the upper surface 132 of the molding compound 130, such that the inducting coil 120 is embedded into the molding compound 130 and disposed around the periphery region of the chip 110.

Subsequently, referring to FIG. 4C, the metal layer 122 is removed by, for example, an etching process, such that the surface of the inducting coil 120 away from the lower surface 134 of the molding compound 130 is substantially aligned with respect to the upper surface 132 of the molding compound 130. Then, as shown in FIG. 4D, the support layer 160 is removed to expose the active surface 112 of the chip 110 and the lower surface 134 of the molding compound 130.

Further referring to FIG. 4E, the via 138 is formed on the lower surface 134 of the molding compound 130, such that the part of the inducting coil 120 is exposed. In this embodiment, the via 138 may be formed by laser drilling. More specifically, drilling may be performed by using carbon dioxide ($CO_2$) laser. Subsequently, referring to FIG. 4F, the redistribution circuit layer 140 is formed on the active surface 112 of the chip 110 and the lower surface 134 of the molding compound 130. As described in the previous embodiment, the redistribution circuit layer 140 includes the protective layer 142, 146, the patterned conductive layer 144, and the plurality of solder pads 148. As shown in FIG. 4F, the patterned conductive layer 144 connects the part of the inducting coil 120 exposed by the via 138 to one of the pads 116, so as to electrically connect the inducting coil 120 and the chip 110. Then, the plurality of solder balls 150 may be disposed on the redistribution circuit layer 140, so as to serve as the external terminals for the chip package structure 100 to be electrically connected with other electronic elements. Accordingly, manufacture of the chip package structure 100 shown in FIG. 4F is substantially completed.

Figure 5A:
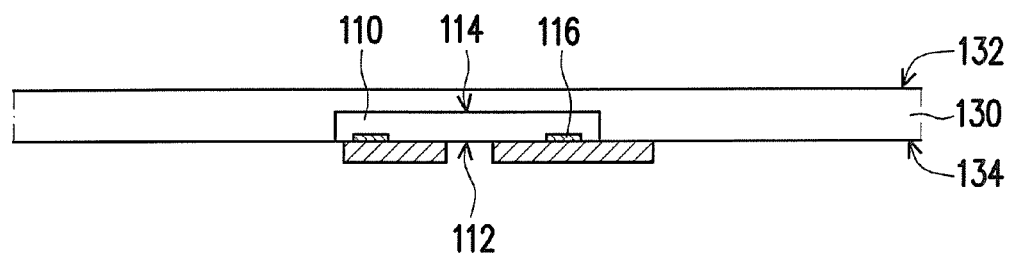
FIGS. 5A to 5B are schematic sectional views showing a flow of a manufacturing method of a chip package structure according to another embodiment of the invention.
Figure 5B:
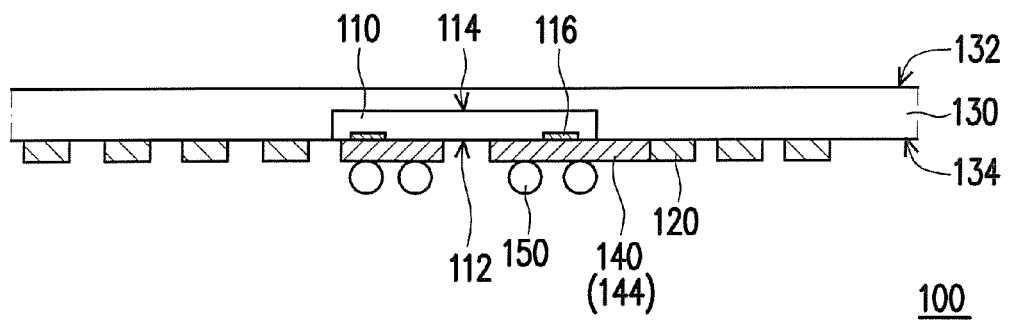

FIGS. 5A to 5B are schematic sectional views showing a flow of a manufacturing method of a chip package structure according to another embodiment of the invention. It should be noted that the chip package structure 100 of this embodiment shown in FIG. 5B is similar to the chip package structure 100 shown in FIG. 1F. Thus, the reference numerals and a part of the contents in the previous embodiment are used in the following embodiments, in which identical reference numerals indicate identical or similar elements, and repeated description of the same technical contents is omitted. For a detailed description of the omitted parts, reference can be found in the previous embodiment, and no repeated description is contained in this embodiment. Description regarding differences between the chip package structure 100 shown in FIG. 5B and the chip package structure 100 shown in FIG. 1F is provided below.

In this embodiment, the inducting coil 120 of the chip package structure 100 may be disposed on the lower surface 134 of the molding compound 130, as shown in FIG. 5B, instead of being embedded into the molding compound 130. The patterned conductive layer 144 of the redistribution circuit layer 140 is connected to the plurality of pads 116 on the active surface 112 of the chip 110 respectively and connects the inducting coil 120 to one of the pads 116. A manufacturing method of the chip package structure 100 shown in FIG. 5B is described below to clearly describe a configuration of elements of the chip package structure 100 of this embodiment.

First of all, referring to FIG. 5A, the chip 110 is provided, and the molding compound 130 is formed on the chip 110. In addition, the molding compound 130 covers the chip 110 and the periphery region of the chip 110, as shown in FIG. 5A. Then, referring to FIG. 5B, the inducting coil 120 is formed on the lower surface 134 of the molding compound 130, and the redistribution circuit layer 140 is formed on the active surface 112 of the chip 110 and the lower surface 134 of the molding compound 130. In addition, the inducting coil 120 surrounds the periphery region of the chip 110. In this embodiment, the redistribution circuit layer 140 includes the patterned conductive layer 144, the protective layer 142, 146, and the plurality of solder pads 148. Moreover, as shown in FIG. 5B, the patterned conductive 144 connects the inducting coil 120 to one of the pads 116, so as to electrically connect the inducting coil 120 and the chip 110. Then, the plurality of solder balls 150 may be disposed on the redistribution circuit layer 140, so as to serve as the external terminals for the chip package structure 100 to be electrically connected with other electronic elements. Accordingly, the chip package structure 100 shown in FIG. 5B is substantially completed, and the chip package structure 100 may be formed by plating.

Figure 6A:
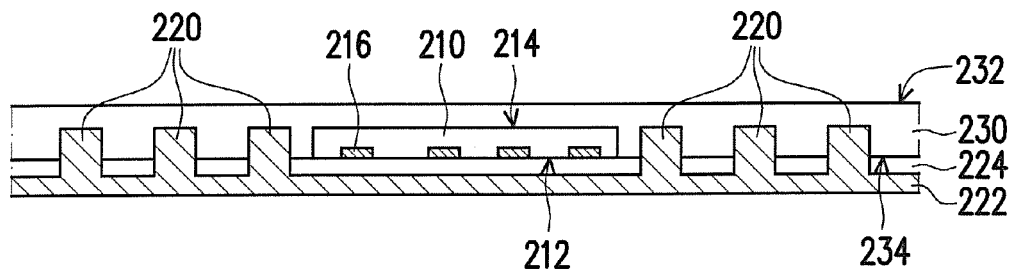
FIGS. 6A to 6B are schematic sectional views showing a flow of a manufacturing method of a chip package structure according to another embodiment of the invention.
Figure 6B:
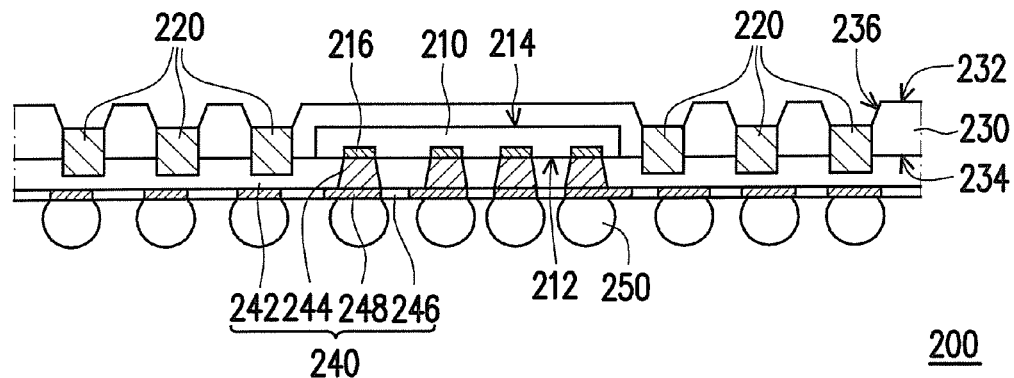

FIGS. 6A to 6B are schematic sectional views showing a flow of a manufacturing method of a chip package structure according to another embodiment of the invention. In this embodiment, a chip package structure 200 includes a chip 210, a plurality of heat dissipating pillars 220, a molding compound 230, and a redistribution circuit layer 240. The chip 210 includes an active surface 212 and a back surface 214 opposite to the active surface 212. In this embodiment, the chip 210 further includes a plurality of pads 216 disposed on the active surface 212 of the chip 210. The heat dissipating pillars 220 are disposed around a periphery region of the chip 210. The molding compound 230 covers the chip 210 and a periphery region of the chip 210 and exposes the active surface 212, such that the heat dissipating pillars 220 are embedded into the molding compound 230, and the molding compound 230 exposes a part of each of the heat dissipating pillars 220. The molding compound 230 includes an upper surface 232 and a lower surface 234 opposite to each other, and the lower surface 234 is substantially aligned with respect to the active surface 214. The redistribution circuit layer 240 covers the active surface 212 and the lower surface 234 of the molding compound 230 and electrically connects the chip 210. In addition, in this embodiment, surfaces of the heat dissipating pillars 220 away from the upper surface 232 of the molding compound 230 are projected from the lower surface 234 of the molding compound 230, and the heat dissipating pillars 220 are not electrically connected with the redistribution circuit layer or other circuit layer on the active surface 214 of the chip 210.

Specifically speaking, in this embodiment, the redistribution circuit layer 240 includes a first protective layer 242, a patterned conductive layer 244, a second protective layer 246, and a plurality of solder pads 248, as shown in FIG. 6B. The first protective layer 242 covers the active surface 212 and the lower surface 234 of the molding compound 230. The patterned conductive layer 244 covers the first protective layer 242 and respectively connects the pads 216. The second protective layer 246 covers the first protective layer 242 and is disposed with a plurality of openings to expose parts of the patterned conductive layer 244. The solder pads 248 are disposed on the second protective layer 246 and are respectively connected with the patterned conductive layer 244 that are exposed by the openings of the second protective layer 246. In this embodiment, the chip package structure 200 may further include a plurality of solder balls 250 that are respectively disposed on the solder pads 248. The solder pad 248 may include an under bump metallurgic layer formed of an adhesion layer, a barrier layer, and a wetting layer, as previously described, so as to enhance a bonding strength between the solder balls 250 and the solder pads 248 and prevent electro-migration.

More specifically speaking, the molding compound 230 may further include a plurality of openings 236. The redistribution circuit layer 240 covers the lower surface 234 of the molding compound 230, and the openings 236 are located on the upper surface 232 of the molding compound 230, so as to respectively expose a top surface of each of the heat dissipating pillars 220, as shown in FIG. 6B. With such an configuration, in the chip package structure 200 of this embodiment, the heat dissipating pillars 220 are disposed around the periphery region of the chip 210, and the heat dissipating pillars 220 are not electrically connected with the chip 210. In addition, the top surfaces of the heat dissipating pillars 220 are exposed by using the openings 236 of the molding compound 230. Consequently, the chip package structure 200 is allowed to discharge heat generated by the chip 210 through the exposed heat dissipating pillars 220, thereby facilitating a heat dissipating efficiency of the chip package structure 200 and saving a cost of disposing an additional heat dissipating element such as a heat dissipating paste or heat dissipating sheet, etc. Besides, in other embodiments, the chip 210 may have a stacked type chip structure that is formed of a plurality of chips stacked with respect to each other. The heat dissipating pillars 220 disposed around the periphery region of the stacked type chip structure thus facilitate lateral heat dissipation of the stacked type chip structure.

Accordingly, the chip package structure 200 shown in FIG. 6B may be manufactured with the manufacturing method shown in FIGS. 1A to 1F. Therefore, FIGS. 1A to 1F are referred to as a detailed flowchart of manufacture. Specifically speaking, manufacturing processes of the chip package structure 200 includes providing a metal layer 222 similar to the metal layer shown in FIG. 1A, as shown in FIG. 6A, disposing a patterned dry film 224 on the metal layer 222, then using the patterned dry film 224 as an plating mask to perform an plating process to form the plurality of heat dissipating pillars 220 shown in FIG. 6B. In addition, the plurality of heat dissipating pillars 220 are disposed around a chip disposition area. Subsequently, the chip 210 is disposed on the patterned dry film 224 to locate the chip 210 in the chip disposition area. Then, the molding compound 230 is formed on the chip 210 and the periphery region of the chip 210, such that the heat dissipating pillars 220 are embedded into the molding compound 230.

Then, the plurality of openings 236 as shown in FIG. 6B are formed on the upper surface 232 of the molding compound 230, such that the top surfaces of the heat dissipating pillars 220 are respectively exposed. Then, the metal layer 222 and the patterned dry film 224 may be removed to expose the active surface 212 of the chip 210 and the lower surface 234 of the molding compound 230. Also, the surfaces of the heat dissipating pillars 220 away from the upper surface 232 are projected from the lower surface 234, as shown in FIG. 6B. Subsequently, as shown in FIG. 6B, the redistribution circuit layer 240 is formed, such that the redistribution circuit layer 240 is electrically connected with the plurality of pads 216 on the active surface 212 of the chip 210. Afterwards, the plurality of solder balls 250 respectively form electrical connection with the redistribution circuit layer 240 to serve as external terminals for the chip package structure 200 to be electrically connected with other electronic elements. Accordingly, manufacture of the chip package structure 200 is substantially completed.

Furthermore, in other embodiments, the heat dissipation pillars may also be embedded into the molding compound 230, such that surfaces of the heat dissipation pillars away from the lower surface 234 are substantially aligned with respect to the upper surface 232 to be exposed by the molding compound 230. Namely, the configuration is similar to the configuration of the inducting coil 130 shown in FIG. 4F. Consequently, the heat dissipating pillars may be disposed around the periphery region of the chip 210 and aligned with respect to the upper surface 232 of the molding compound 230 to be exposed by the molding compound 230. Accordingly, the heat generated by the chip 210 may be discharged through the exposed heat dissipating pillars 220, thereby facilitating the heat dissipating efficiency.

Figure 7:
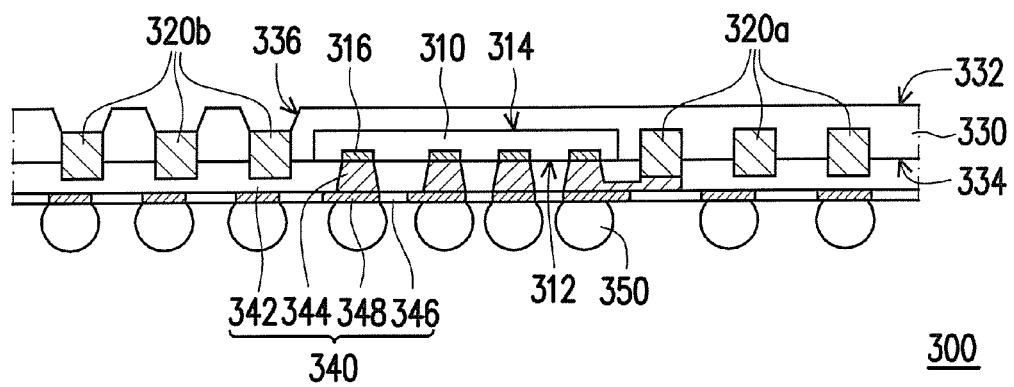
FIG. 7 is a schematic sectional view of a chip package structure according to another embodiment of the invention.

FIG. 7 is a schematic sectional view of a chip package structure according to another embodiment of the invention. Referring to FIG. 7, in this embodiment, a chip package structure 300 includes a chip 310, at least one inducting coil 320a, a plurality of heat dissipating pillars 320b, a molding compound 330, and a redistribution circuit layer 340. The chip 310 includes an active surface 312, a back surface 314 opposite to the active surface 312, and a plurality of pads 316 disposed on the active surface 312. The inducting coil 320a is disposed around a first periphery region of the chip 310. The heat dissipating pillars 320b are disposed around a second periphery region of the chip 310. In this embodiment, the first and second periphery regions are not overlapped with each other but surround the chip 310. The molding compound 330 covers the chip 310, the first periphery region, and the second periphery region. In this embodiment, the molding compound 330 includes an upper surface 332 and a lower surface 334 opposite to each other. In addition, the lower surface 334 of the molding compound 330 is substantially aligned with respect to the active surface 312 of the chip 310 to expose the active surface 312. The inducting coil 320a and the heat dissipating pillars 320b are disposed on the molding compound 330, the molding compound 330 exposes a part of each of the heat dissipating pillars 320b, and the redistribution circuit layer 340 covers the active surface 312 and the lower surface 334 of the molding compound 330. Furthermore, the redistribution circuit layer 340 is connected with the pads 316 respectively and connects the inducting coil 320a with one of the pads 316, so as to electrically connect the chip 310 and the inducting coil 320a. The heat dissipating pillars 320b are not electrically connected with the redistribution circuit layer 340 or other circuit layer on the chip 310.

Specifically speaking, in this embodiment, the redistribution circuit layer 340 includes a first protective layer 342, a patterned conductive layer 344, a second protective layer 346, and a plurality of solder pads 348. The first protective layer 342 covers the active surface 312 and the lower surface 334 of the molding compound 330. The patterned conductive layer 344 covers the first protective layer 342, respectively connects the pads 316, and electrically connects the inducting coil 320a to one of the pads 316. The second protective layer 346 covers the first protective layer 342 and exposes at least parts of the patterned conductive layer 344. The solder pads 348 are disposed on the second protective layer 346 and respectively connected with the parts of the patterned conductive layer 344 that are exposed by the second protective layer 346. In this embodiment, the chip package structure 300 may further include a plurality of solder balls 350 respectively disposed on the solder pads 348. In addition, the solder pad 348 may include an under bump metallurgic layer as previously described, so as to enhance a bonding strength between the solder balls 350 and the solder pads 348 and prevent electro-migration.

Accordingly, the chip package structure 300 of this embodiment may be manufactured in a manufacturing method similar to the manufacturing method shown in FIGS. 1A to 1F, except that compared with the process of forming the inducting coil 120 with a patterning process in FIG. 1B, the inducting coil 320a and the plurality of heat dissipating pillars 320b are simultaneously formed around the chip 310 by using one single patterning process. Then, the molding compound 330 covers thereon, such that the inducting coil 320a and the heat dissipating pillars 320b are respectively embedded into the molding compound 330, and surfaces of the inducting coil 320a and the heat dissipating pillars 320b away from the upper surface 332 are projected from the lower surface 334. Subsequently, a plurality of openings 336 are formed on the upper surface 332 of the molding compound 330 to expose top surfaces of the heat dissipating pillars 320b. Then, the redistribution circuit layer 340 is formed, such that the redistribution circuit layer 340 is connected with the pads 316 on the active surface 312 respectively and electrically connects the inducting coil 320a to one of the pads 316. In this embodiment, the redistribution circuit layer 340 may include a patterned conductive layer 344 that connects a part of the inducting coil 320a projected from the lower surface 334 to one of the pads 316. Afterwards, the plurality of solder balls 350 respectively form electrical connection with the redistribution circuit layer 340 to serve as external terminals for the chip package structure 300 to be electrically connected with other electronic elements. Accordingly, manufacture of the chip package structure 300 is substantially completed.

In addition, in other embodiments, the inducting coil and the heat dissipating pillars of the chip package structure 300 may be configured in accordance with the configuration of the inducting coil 130 shown in FIG. 4F. Namely, the inducting coil and the heat dissipating pillars are embedded into the molding compound 330, and surfaces of the inducting coil and the heat dissipating pillars away from the lower surface 334 may be aligned with respect to the upper surface 332, such that the heat dissipating pillars are exposed by the molding compound 330. In addition, the via 138 shown in FIG. 4F may be formed on the lower surface 234 of the molding compound 330 to expose a part of the inducting coil and allow the patterned conductive layer 344 of the redistribution circuit layer 340 to connect the part of the inducting coil exposed by the via to one of the pads 316. Consequently, the inducting coil and the heat dissipating pillars may be disposed around the periphery regions of the chip 310 and expose the heat dissipating pillars from the molding compound 330, such that heat generated by the chip 310 may be discharged through the exposed heat dissipating pillars, thereby facilitating a heat dissipating efficiency.

In view of the foregoing, the inducting coil is disposed around the periphery region of the chip in the chip package structure of the invention to serve as an inductance element of the chip package structure. In this way, the area to dispose the inducting coil is no longer limited to a surface of the chip, and the inductance disposition area of the chip package structure is increased to thereby increase the inductance of the chip package structure. Besides, compared with the conventional art that directly disposes the inductance element on the active surface of the chip, the inducting coil of the invention is disposed around the chip, and is thus capable of reducing signal interference between the inducting coil and the chip and consequently facilitating the reception quality.

Furthermore, in the chip package structure of the invention, the plurality of heat dissipating pillars may also be disposed around the periphery region of the chip, the heat dissipating pillars are not electrically connected with the chip, and the top surfaces of the heat dissipating pillars are exposed by the molding compound. Consequently, the chip package structure is allowed to discharge the heat generated by the chip through the heat dissipating pillars disposed around the chip, thereby facilitating the heat dissipating efficiency of the chip package structure and saving the cost of disposing an additional heat dissipating element such as a heat dissipating paste or heat dissipating sheet, etc. In addition, as the invention utilizes a well-developed semiconductor manufacturing process to realize the inducting coil and the heat dissipating pillars as the inductance element and the heat dissipating element in the chip package structure, the ease of manufacture consequently leads to an easier mass production and lower manufacture cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
a chip, comprising an active surface and a back surface opposite to the active surface;
a plurality of heat dissipating pillars, disposed around a periphery region of the chip;
a molding compound, covering the chip and the periphery region and exposing the active surface, wherein the heat dissipating pillars are disposed at the molding compound, and the molding compound exposes a part of each of the heat dissipating pillars, the molding compound comprises an upper surface, a lower surface opposite to the upper surface, and a plurality of openings, the lower surface is substantially aligned with respect to the active surface, the openings are located on the upper surface, the heat dissipating pillars are embedded into the molding compound, a surface of each of the heat dissipating pillar away from the upper surface is projected from the lower surface, and each of the openings exposes a top surface of a corresponding one of the heat dissipating pillars; and
a redistribution circuit layer, covering the active surface and the lower surface of the molding compound, and the redistribution circuit layer being electrically connected with the chip.

2. The chip package structure as claimed in claim 1, wherein the redistribution circuit layer covers the surface of each of the heat dissipating pillar away from the upper surface.

3. The chip package structure as claimed in claim 1, wherein the molding compound comprises an upper surface and a lower surface opposite to the upper surface, the lower surface is substantially aligned with respect to the active surface, the heat dissipating pillars are embedded into the molding compound, and surfaces of the heat dissipating pillars away from the lower surface are aligned with respect to the upper surface to be exposed by the molding compound.

4. The chip package structure as claimed in claim 1, wherein the redistribution circuit layer comprises a first protective layer, a patterned conductive layer, a second protective layer, and a plurality of solder pads.

5. The chip package structure as claimed in claim 4, wherein the first protective layer covers the active surface and the lower surface of the molding compound, the patterned conductive layer is disposed at the first protective layer and electrically connected to the chip, the solder pads are disposed on the first protective layer and electrically connected to the patterned conductive layer, and the second protective layer is disposed on the first protective layer and exposes the solder pads.

6. The chip package structure as claimed in claim 4, further comprising a plurality of solder balls respectively disposed on the solder pads.

7. A chip package structure, comprising:
a chip, comprising an active surface and a back surface opposite to the active surface;
at least one inducting coil, disposed around a first periphery region of the chip;
a plurality of heat dissipating pillars, disposed around a second periphery region of the chip, wherein the first and second periphery regions are not overlapped with each other;
a molding compound, covering the chip, the first periphery region, and the second periphery region, and the molding compound exposing the active surface, wherein the inducting coil and the heat dissipating pillars are disposed on the molding compound, and the molding compound exposes a part of each of the heat dissipating pillars; and
a redistribution circuit layer, covering the active surface and a part of the molding compound, and the redistribution circuit layer being electrically connected with the chip.

8. The chip package structure as claimed in claim 7, wherein the chip further comprises a plurality of pads disposed on the active surface, and the redistribution circuit layer electrically connects the inducting coil to one of the pads.

9. The chip package structure as claimed in claim 8, wherein the redistribution circuit layer comprises a patterned conductive layer that connects a part of the inducting coil projected from the lower surface to one of the pads.

10. The chip package structure as claimed in claim 8, wherein the molding compound further comprises a via that exposes a part of the inducting coil, the redistribution circuit layer comprises a patterned conductive layer, and the patterned conductive layer connects the part exposed by the via to one of the pads.

11. The chip package structure as claimed in claim 10, wherein the via is disposed at the lower surface of the molding compound.

12. The chip package structure as claimed in claim 7, wherein the molding compound comprises an upper surface, a lower surface opposite to the upper surface, and a plurality of openings, the lower surface is substantially aligned with respect to the active surface, the inducting coil and the heat dissipating pillars are embedded into the molding compound, surfaces of the inducting coil and the heat dissipating pillars away from the upper surface are projected from the lower surface, the openings are located on the upper surface, and each of the openings exposes a top surface of a corresponding one of the heat dissipating pillars.

13. The chip package structure as claimed in claim 12, wherein the redistribution circuit layer covers the surfaces of the inducting coil and the heat dissipating pillars away from the upper surface.

14. The chip package structure as claimed in claim 7, wherein the molding compound comprises an upper surface and a lower surface opposite to the upper surface, the lower surface is substantially aligned with respect to the active surface, the inducting coil and the heat dissipating pillars are embedded into the molding compound, and surfaces of the inducting coil and the heat dissipating pillars are aligned with respect to the upper surface.

15. The chip package structure as claimed in claim 7, wherein the redistribution circuit layer comprises a first protective layer, a patterned conductive layer, a second protective layer, and a plurality of solder pads.

16. The chip package structure as claimed in claim 15, further comprising a plurality of solder balls respectively disposed on the solder pads.

17. The chip package structure as claimed in claim 7, wherein the first protective layer covers the active surface and the lower surface of the molding compound, the patterned conductive layer is disposed at the first protective layer and electrically connects the inducting coil and the chip, the solder pads are disposed on the first protective layer and electrically connected to the patterned conductive layer, and the second protective layer disposed on the first protective layer and exposes the solder pads.

18. The chip package structure as claimed in claim 7, wherein the first periphery region and second periphery region surround the chip together.

* * * * *